United States Patent
Son et al.

(10) Patent No.: US 8,547,763 B2
(45) Date of Patent: Oct. 1, 2013

(54) MEMORY CELL, METHODS OF MANUFACTURING MEMORY CELL, AND MEMORY DEVICE HAVING THE SAME

(75) Inventors: Jong-Pil Son, Yongin-si (KR); Seong-Jin Jang, Seongnam-si (KR); Byung-Sik Moon, Seoul (KR); Doo-Young Kim, Seongnam-si (KR); Ju-Seop Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 115 days.

(21) Appl. No.: 13/219,998

(22) Filed: Aug. 29, 2011

(65) Prior Publication Data
US 2012/0051164 A1 Mar. 1, 2012

(30) Foreign Application Priority Data
Aug. 30, 2010 (KR) .................. 10-2010-0083785

(51) Int. Cl.
*G11C 7/00* (2006.01)
*G11C 11/405* (2006.01)
(52) U.S. Cl.
CPC .................. *G11C 11/405* (2013.01)
USPC ............ 365/200; 365/63; 365/51; 365/225.7; 365/185.01

(58) Field of Classification Search
CPC ......... G06F 5/10; G06F 7/785; G11C 7/1006; G11C 7/1045; G11C 7/1051
USPC ............ 365/230.03, 189.08, 230.06, 189.02, 365/189.05
See application file for complete search history.

(56) References Cited

U.S. PATENT DOCUMENTS

| 6,787,878 B1 | 9/2004 | Nagai et al. |
| 7,471,540 B2 | 12/2008 | Luan et al. |
| 2007/0257331 A1 | 11/2007 | Kurjanowicz et al. |
| 2009/0080275 A1* | 3/2009 | Vo et al. ................... 365/206 |

FOREIGN PATENT DOCUMENTS

| JP | 2001-176975 A | 6/2001 |
| KR | 10-2009-0103613 A | 10/2009 |

* cited by examiner

*Primary Examiner* — Thong Q Le
(74) *Attorney, Agent, or Firm* — Lee & Morse, P.C.

(57) ABSTRACT

A memory cell includes a selection transistor on a substrate and an antifuse on the substrate. The selection transistor includes a first gate connected to a read word line, a first gate insulation layer that insulates the first gate from the substrate, a first source region connected to a bit line, and a first drain region, an impurity concentration of the first drain region being lower than an impurity concentration of the first source region. The antifuse includes a first electrode connected to a program word line and a second electrode connected to the selection transistor.

13 Claims, 7 Drawing Sheets

MEMORY CELL, METHODS OF MANUFACTURING MEMORY CELL, AND MEMORY DEVICE HAVING THE SAME

CROSS-REFERENCE TO RELATED APPLICATION

This application claims priority under 35 USC §119 to Korean Patent Application No. 10-2010-0083785, filed on Aug. 30, 2010, in the Korean Intellectual Property Office, and entitled: "Memory Cell, Methods of Manufacturing Memory Cell, and Memory Device Having the Same," which is incorporated by reference herein in its entirety.

BACKGROUND

A memory cell may include an antifuse, e.g., the antifuse may be arranged in a memory cell array. The antifuse may be described as an electric device that operates in an opposite manner in comparison to a fuse. For example, a fuse may have a relatively low resistance before being programmed and may have a relatively high resistance after being programmed. In contrast, an antifuse may have a relatively high resistance before being programmed and may have a relatively low resistance after being programmed.

SUMMARY

Embodiments may be realized by providing a memory cell that includes a selection transistor on a substrate and an antifuse on the substrate. The selection transistor includes a first gate connected to a read word line, a first gate insulation layer that insulates the first gate from the substrate, a first source region connected to a bit line, and a first drain region. An impurity concentration of the first drain region is lower than an impurity concentration of the first source region. The antifuse includes a first electrode connected to a program word line and a second electrode connected to the selection transistor.

The second electrode of the antifuse may be connected to the first drain region of the selection transistor.

The substrate may include a first portion and a second portion. The first portion of the substrate may be adjacent to a side of the first drain region that faces the first source region, the second portion of the substrate may be adjacent to a side of the first source region that faces the first drain region, and an impurity concentration of the first portion of the substrate may be lower than an impurity concentration of the second portion of the substrate.

The memory cell may include further comprising a halo doped region. The halo doped region may be only in the second portion of the substrate between the first drain region and the first source region.

The first source region may have a lightly doped structure. The lightly doped structure may include a first impurity region and a second impurity region. An impurity concentration of the first impurity region may be lower than an impurity concentration of the second impurity region and the first drain region may include only an impurity region having the impurity concentration of the first impurity region.

The antifuse may include a second gate connected to the program word line, a second gate insulation layer that insulates the second gate from the substrate, a second source region connected to the first drain region, and a second drain region that is floated. The first gate insulation layer may be thicker than the second gate insulation layer.

The second source region may be spaced apart from the first drain region in the substrate, and the second source region may be electrically connected to the first drain region by a wiring on the substrate.

The first drain region may be formed by a first ion implantation process, and the first source region, the second source region, and the second drain region may be formed by a second ion implantation process. The impurity concentration of the first drain region may be lower than the impurity concentration of the first source region, an impurity concentration of the second source region, and an impurity concentration of the second drain region formed by the second ion implantation process.

The second source region may be electrically connected to the first drain region by a common impurity region between the second source region and the first drain region.

The first drain region and the second source region may be formed by a first ion implantation process, and the first source region and the second drain region may be formed by a second ion implantation process. The impurity concentration of the first drain region and an impurity concentration of the second source region formed by the first ion implantation process may be lower than the impurity concentration of the first source region and an impurity concentration of the second drain region formed by the second ion implantation process.

The antifuse may include a second gate, a second drain region, and a second source region, and the second gate may be adjacent to the first gate of the selection transistor. The first drain region of the selection transistor may be at a first upper portion of the substrate and may be adjacent to a first side of the first gate that faces the second gate. The first source region of the selection transistor may be at a second upper portion of the substrate and may be adjacent to a second side of the first gate that opposes the first side of the first gate. The second drain region and the second source region of the antifuse may be at other upper portions of the substrate adjacent to a first side and a second side of the second gate, respectively. An impurity concentration of the second drain region, an impurity concentration of the second source region, and the impurity concentration of the first source region may be higher than the impurity concentration of the first drain region.

Embodiments may also be realized by providing a method of manufacturing a memory cell that includes a first insulation layer and a second insulation layer formed on a substrate. A first gate and a second gate are formed on the first gate insulation layer and the second gate insulation layer, respectively. A first drain region is formed at upper portions of the substrate adjacent to a first side of the first gate in a direction of the second gate by implanting impurities into the substrate, where the first drain region has a relatively low impurity concentration. A mask pattern is formed over the substrate, where the mask pattern covers the first drain region. A first source region is formed at upper portions of the substrate adjacent to a second side of the first gate, and a second drain region and a second source region are formed at upper portions of the substrate adjacent to a first side and a second side of the second gate, respectively, by implanting impurities into the substrate, where the first source region, the second drain region and the second source region has a relatively high impurity concentration.

Embodiments may also be realized by providing a nonvolatile memory device that includes a memory cell array and a controller. The memory cell array includes a plurality of memory cells, and each of the plurality of memory cells includes a selection transistor on a substrate and an antifuse on the substrate. The controller performs a programming operation or a reading operation on the memory cell array according to an operation mode. The selection transistor includes a gate connected to a read word line, a gate insulation layer that insulates the gate from the substrate, a source region connected to a bit line, and a drain region. An impurity concentration of the drain region is lower than an impurity concentration of the source region. The antifuse includes a first electrode connected to a program word line and a second electrode connected to the selection transistor.

The second electrode of the antifuse may be connected to the drain region of the selection transistor.

The substrate may include a first portion and a second portion. The first portion of the substrate may be adjacent to a side of the drain region that faces the source region, the second portion of the substrate may be adjacent to a side of the source region that faces the drain region, and an impurity concentration of a first portion of the substrate may be lower than an impurity concentration of the second portion of the substrate.

The substrate may include a halo doped region. The halo doped region may be only in the second portion of the substrate between the drain region and source region.

Embodiments may also be realized by providing a memory device that includes a memory cell array including normal memory cells and redundancy memory cells, and a redundancy circuit including a plurality of memory cells. The plurality of memory cells store an address of a failed cell among the normal memory cells such that when an address received from an outside for a read or write operation corresponds to the address of the failed cell stored in the plurality of memory cells the read or write operation is directed to the redundancy memory cells. Each of the plurality of memory cells in the redundancy circuit includes a selection transistor on a substrate and an antifuse on the substrate. The selection transistor includes a gate connected to a read word line, a gate insulation layer insulating the gate from the substrate, a source region connected to a bit line, and a drain region. An impurity concentration of the drain region is lower than an impurity concentration of the source region. The antifuse includes a first electrode connected to a program word line and a second electrode connected to the selection transistor.

The second electrode of the antifuse may be connected to the drain region of the selection transistor.

The substrate may include a first portion and a second portion. The first portion of the substrate may be adjacent to a side of the drain region that faces the source region, the second portion of the substrate may be adjacent to a side of the source region that faces the drain region, and an impurity concentration of the first portion of the substrate may be lower than an impurity concentration of the second portion of the substrate.

The substrate may include a halo doped region. The halo doped region may be only in the second portion of the substrate between the drain region and the source region.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Various example embodiments will be described more fully with reference to the accompanying drawings; however, they may be embodied in many different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items. Like reference numerals refer to like elements throughout this application.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
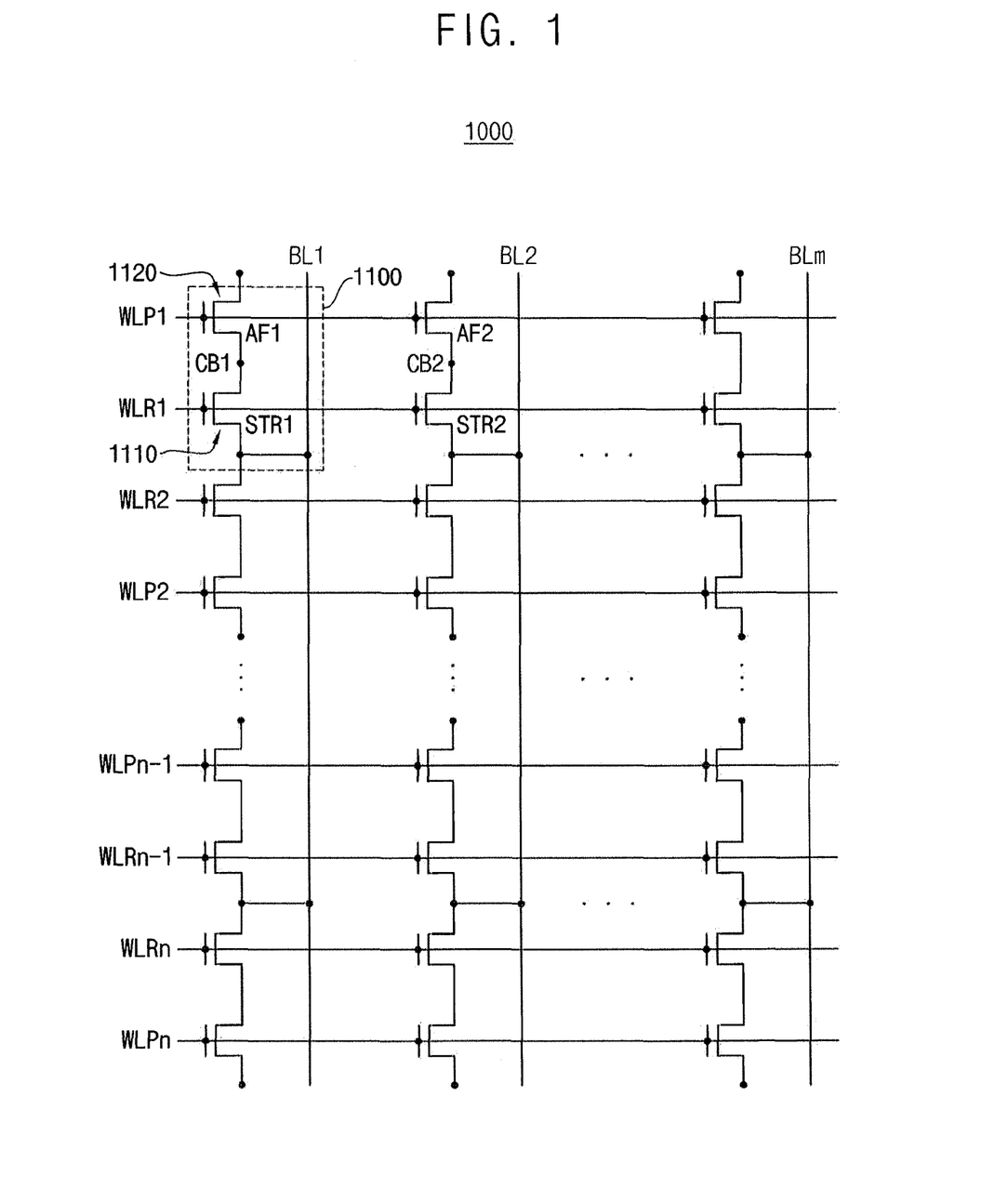
FIG. 1 illustrates a diagram of a memory cell array including a memory cell, according to exemplary embodiments.

FIG. 1 illustrates a diagram of a memory cell array including a memory cell, according to exemplary embodiments.

Referring to FIG. 1, a memory cell array 1000 may include a plurality of memory cells 1100. The plurality of memory cells 1100 may be placed in an n*m matrix form, where n and m are positive integers. The plurality of memory cells 1100 may be connected to a plurality of read word lines WLR1, . . . , WLRn, a plurality of program word lines WLP1, ..., WLPn, and a plurality of bit lines BL1, ..., BLm. For example, as illustrated in FIG. 1, one member cell 1100 may be connected to one read word line WLR1, one program word line WLP1, and one bit line BL1.

Each of the plurality of memory cells 1100 may include a selection transistor 1110 and an antifuse 1120. The selection transistor 1110 and the antifuse 1120 may be formed on a same substrate.

The selection transistor 1110 may include a gate connected to a corresponding read word line WLRx, a source region connected to a corresponding bit lines BLy, and a drain region connected to the antifuse 1120. According to an exemplary embodiment, x is a positive integer equal to or smaller than n, and y is a positive integer equal to or smaller than m. Alternatively, x may be a positive integer equal to or smaller than m, and y may be a positive integer equal to or smaller than n. The selection transistor 1110 may have an asymmetrical structure such that the drain region of the selection transistor 1110 has a lower impurity concentration than an impurity concentration of the source region of the selection transistor 1110.

The antifuse 1120 may include a first terminal, e.g., a first electrode, connected to a corresponding program word line WLPx. The antifuse 1120 may include a second terminal, e.g., a second electrode, connected to the drain region of the selection transistor 1110.

The antifuse 1120 may include, e.g., a metal oxide semiconductor field effect transistor (MOSFET). In this case, a gate of the MOSFET may be the first electrode of the antifuse 1120, and the gate may be connected to the corresponding program word line WLPx. A source region of the MOSFET may be the second electrode of the antifuse 1120, and the source region may be connected to the drain region of the selection transistor 1110. A drain region of the MOSFET may be floated. However, in a MOSFET, a leakage current, e.g., a gate-induced drain leakage (GIDL) current, may occur in the drain region. As the voltage of the drain region is higher than the voltage of the gate, the GIDL current may increase.

Figure 2:
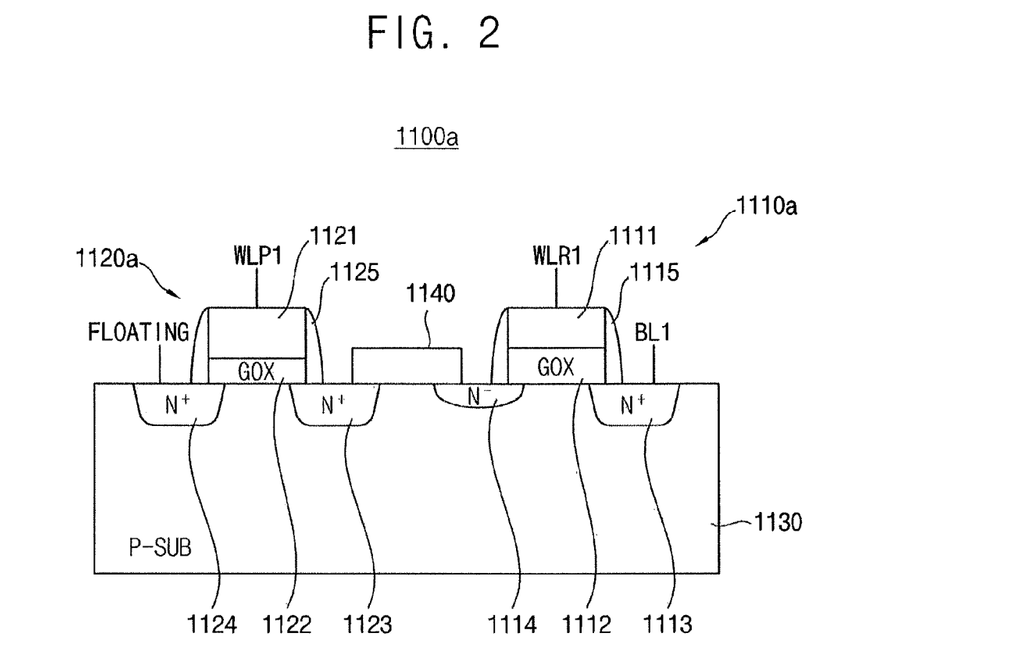
FIGS. 2 to 7 illustrate cross-sectional views of exemplary memory cells included in a memory cell array of FIG. 1.

FIG. 2 illustrates a cross-sectional view of an exemplary memory cell included in a memory cell array of FIG. 1.

FIG. 2 represents a memory cell 1100a that is connected to a read word line WLR1, a program word line WLP1, and a bit line BL1. Referring to FIG. 2, the memory cell 1100a may include a selection transistor 1110a and an antifuse 1120a. Both the selection transistor 1110a and the antifuse 1120a may be formed on a same substrate P-SUB 1130.

The selection transistor 1110a may include a first gate 1111 connected to the read word line WLR1 and a first gate insulation layer GOX 1112 insulating the first gate 1111 from the substrate 1130. The first gate 1111 may be stacked on, e.g., directly on, the first gate insulation layer 1112. The stacked structure of the first gate 1111 and the first gate insulation layer 1112 may be surrounded by a first spacer 1115. The selection transistor 1110a may include a first source region 1113 connected to the bit line BL1 and a first drain region 1114 connected, e.g., electrically connected, to a second source region 1123 of the antifuse 1120a.

The selection transistor 1110a may have an asymmetrical structure such that the first drain region 1114 of the selection transistor 1110a may have a lower impurity concentration than an impurity concentration of the first source region 1113 of the selection transistor 1110a. The first drain region 1114 may have a first impurity concentration and the first source region 1113 may have a second impurity concentration such that the first impurity concentration is lower than the second impurity concentration.

The antifuse 1120a may include a second gate 1121 connected to the program word line WLP1 and a second gate insulation layer GOX 1122 insulating the second gate 1121 from the substrate 1130. The second gate 1121 may be stacked on, e.g., directly on, the second gate insulation layer 1122. The stacked structure of the second gate 1121 and the second gate insulation layer 1122 may be surrounded by second spacer 1125. The antifuse 1120a may include a second source region 1123 connected, e.g., electrically connected, to the first drain region 1114 of the selection transistor 1110a and a second drain region 1124 that is floated.

The second source region 1123 of the antifuse 1120a may include an impurity region separated, e.g., spaced apart from by a predetermined distance, from the first drain region 1114 and the first source region 1113 of the selection transistor 1110a. The second source region 1123 may be electrically connected to the first drain region 1114 by a wiring 1140. The wiring 1140 may include a metal line disposed above the substrate 1130, e.g., the wiring 1140 may be above the substrate 1130 in an area between the selection transistor 1110a and the antifuse 1120a. The wiring 1140 may include a connecting structure, such as a via, for connecting the metal line of the wiring 1140 to the first drain region 1114 and the second source region 1123.

According to an exemplary embodiment, the substrate 1130 may be doped with P-type impurities, and the first source region 1113, the first drain region 1114, the second source region 1123 and the second drain region 1124 may be doped with N-type impurities. Alternatively, the substrate 1130 may be doped with N-type impurities, and the first source region 1113, the first drain region 1114, the second source region 1123 and the second drain region 1124 may be doped with P-type impurities.

An N-type impurity concentration, e.g., an N+ type impurity concentration, in the first source region 1113 may be relatively high, and an N-type impurity concentration, e.g., an N− type impurity concentration, of the first drain region 1114 may be relatively low, according to an exemplary embodiment.

The selection transistor 1110a may further include the first spacer 1115 formed on, e.g., directly on, sidewalls of the first gate 1111 and the first gate insulation layer 1112. A height of the first spacer 1115 may be substantially equal to a height of the stacked structure that includes the first gate 1111 and the first gate insulation layer 1112. The antifuse 1120a may further include the second spacer 1125 formed on, e.g., directly on, sidewalls of the second gate 1121 and the second gate insulation layer 1122. A height of the second spacer 1125 may be substantially equal to a height of the stacked structure that includes the second gate 1121 and the second gate insulation layer 1122.

Figure 3:
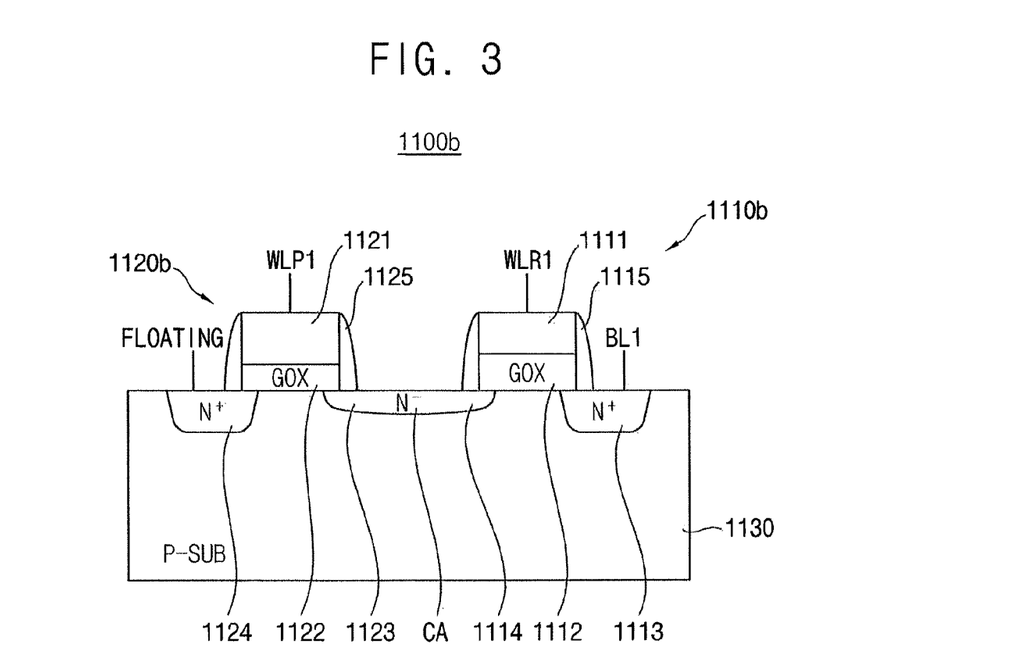

FIG. 3 illustrates a cross-sectional view of another exemplary embodiment of a memory cell included in a memory cell array of FIG. 1. FIG. 3 illustrates a memory cell 1100b that is connected to the read word line WLR1, the program word line WLP1 and the bit line BL1.

Referring to FIG. 3, the memory cell 1100b may include a selection transistor 1110b and an antifuse 1120b. The memory cell 1100b may have a structure that is substantially similar to the memory cell 1100a of FIG. 2, except that the second source region 1123 is electrically connected to the first drain region 1114 by sharing a common impurity region CA with the first drain region 1114. Thus, a detailed description of the memory cell 1100b, except for the differences between the memory cell 1100b of FIG. 3 and the memory cell 1100a of FIG. 2, will be omitted.

As illustrated in FIG. 3, the second source region 1123 of the antifuse 1120b may share the common impurity region CA with the first drain region 1114 of the selection transistor 1110b. Therefore, the memory cell 1100b of FIG. 3 may be easily manufactured, e.g., more easily manufactured than the memory cell 1100a of FIG. 2. The common impurity region CA, which may be between the second source region 1123 and the first drain region 1114, may have a lower impurity concentration than an impurity concentration of the first source region 1113 of the selection transistor 1110b and the second drain region 1124 of the antifuse 1120b. The impurity concentration of the common impurity region CA may correspond to the impurity concentrations of the second source region 1123 and the first drain region 1114.

Figure 4:
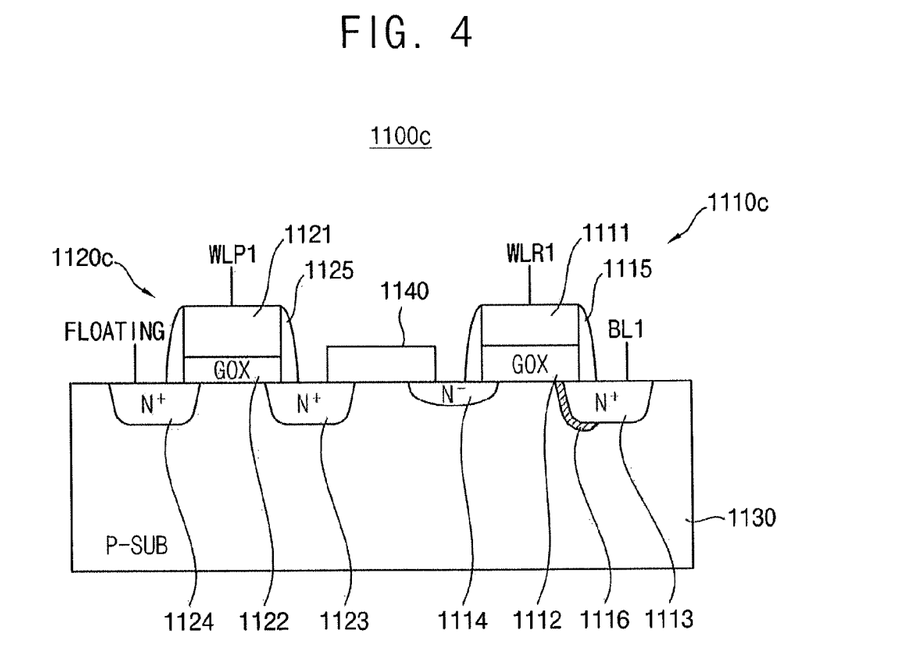

FIG. 4 illustrates a cross-sectional view of another exemplary embodiment of a memory cell included in a memory cell array of FIG. 1. FIG. 4 illustrates a memory cell 1100c that is connected to the read word line WLR1, the program word line WLP1 and the bit line BL1. The memory cell 1100c may include a selection transistor 1110c and an antifuse 1120c.

The memory cell 1100c may have substantially a same structure as the memory cell 1100a of FIG. 2, except that an impurity concentration of a first portion of the substrate 1130, which is adjacent to the first drain region 1114 in a direction of the first source region 1113, is different from an impurity concentration of a second portion of the substrate 1130, which is adjacent to the first source region 1113 in a direction of the first drain region 1114. Thus, a detailed description of the memory cell 1100c, except for the differences between the memory cell 1100c of FIG. 4 and the memory cell 1100a of FIG. 2, will be omitted.

The impurity concentration of the first portion of the substrate 1130 may be lower than the impurity concentration of the second portion of the substrate 1130. For example, as illustrated in FIG. 4, a halo doped region 1116 may be formed in the second portion of the substrate 1130. The halo doped region 1116 may not be formed, i.e., may be excluded, in the first portion of the substrate 1130. The second portion of the substrate 1130 may be defined, e.g., entirely defined, by the halo doped region 1116.

In the memory cell 1100c of FIG. 4, the halo doped region 1116 may be formed in the second portion of the substrate 1130 and may not be formed in the first portion of the substrate 1130. The second portion of the substrate 1130 may be adjacent to the first source region 1113 in a direction of the first drain region 1114, e.g., may be formed adjacent to a side of the first source region 1113 that faces the first drain region 1114. halo doped region 1116 may be formed along only a partial portion a boundary that defines the first source region 1113, e.g., the halo doped region 1116 may be formed along approximately half the boundary that defines the first source region 1113. For example, the halo doped region 1116 may be excluded on a side of the first source region 1113 that faces away from the first drain region 1114. The halo doped region 1116 may be formed under the selection transistor 1110c, e.g., the halo doped region 1116 may be formed only under the selection transistor 1110c and the first spacer 1115.

The first portion of the substrate 1130 may be adjacent to the first drain region 1114 in a direction of the first source region 1113, e.g., may be an area of the substrate 1130 that is adjacent to a side of the first drain region 1114 that faces the first source region 1113. The first source region 1113 and the first drain region 1114 may be spaced apart by the first and second portions of the substrate 1130. Without intending to be bound by this theory, even if the voltage of the first drain region 1114 is higher than the voltage of the first gate 1111, a possibility of a program disturbance may be reduced and/or prevented since the width of P-N junction between the first drain region 1114 and the substrate 1130 may be increased to, e.g., decrease a gate-induced drain leakage (GIDL) current.

A halo doped region could be formed both in a first portion of a substrate, which is adjacent to a drain region, and in a second portion of the substrate, which is adjacent to a source region, to reduce a short channel effect. The halo doped region may be formed, e.g., by implanting P-type impurities having a relatively high concentration into the substrate when the substrate is doped with P-type impurities, and may be formed by implanting N-type impurities having a relatively high concentration into the substrate when the substrate is doped with N-type impurities. However, without intending to be bound by this theory, if the halo doped region is formed in the first portion of the substrate, which is adjacent to a drain region, and a voltage of the drain region is higher than a voltage of the gate, a width of a P-N junction between the drain region and the substrate may be reduced and the GIDL current may be increased.

Figure 5:
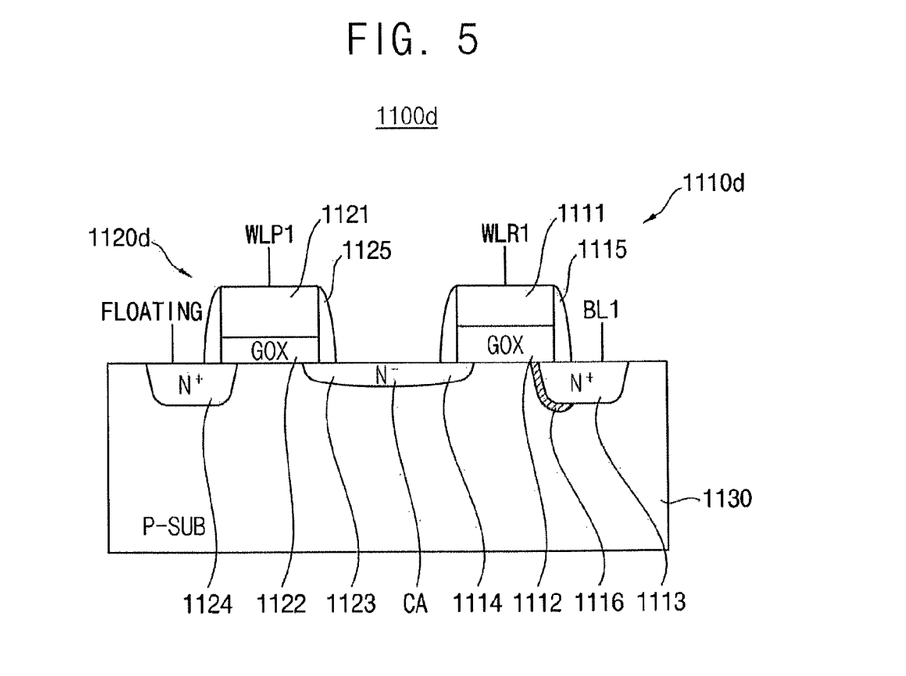

FIG. 5 illustrates a cross-sectional view of another exemplary embodiment of a memory cell included in a memory cell array of FIG. 1. FIG. 5 illustrates a memory cell 1100d that is connected to the read word line WLR1, the program word line WLP1 and the bit line BL1. The memory cell 1100d may include a selection transistor 1110d and an antifuse 1120d.

The memory cell 1100d may have substantially a same structure as the memory cell 1100b of FIG. 3, except that the halo doped region 1116 is formed in a second portion of the substrate 1130, which is adjacent to the first source region 1113 in a direction of the first drain region 1114 that includes the common impurity region CA. The halo doped region 1116 was described above with reference to FIG. 4. Thus, a detailed description of the memory cell 1100d will be omitted.

Figure 6:
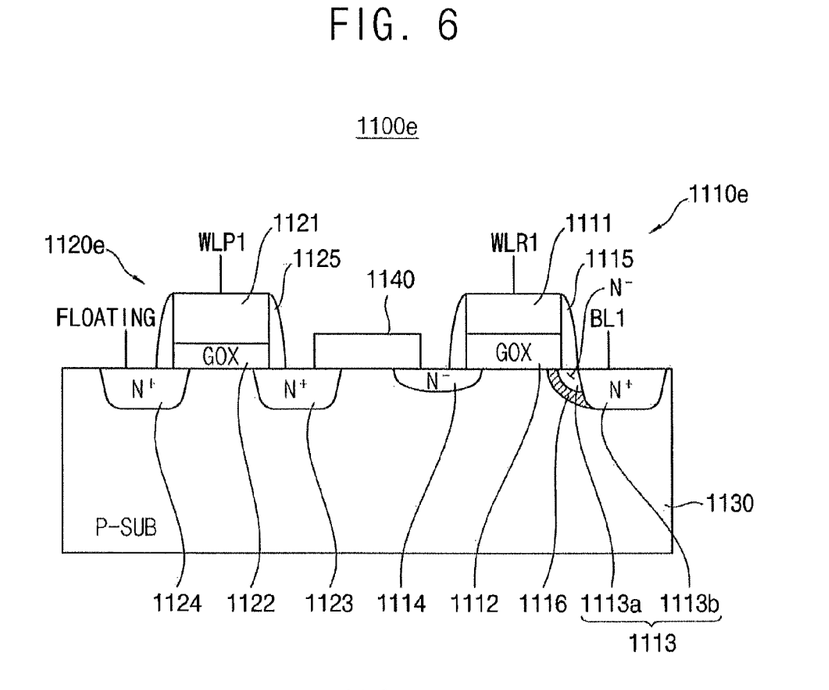

FIG. 6 illustrates a cross-sectional view of another exemplary embodiment of a memory cell included in a memory cell array of FIG. 1. FIG. 6 illustrates a memory cell 1100e that is connected to the read word line WLR1, the program word line WLP1 and the bit line BL1. The memory cell 1100e may include a selection transistor 1110e and an antifuse 1120e.

The memory cell 1100e may have substantially a same structure as the memory cell 1100c of FIG. 4, except that the first source region 1113 of the selection transistor 1110e has a lightly doped drain (LDD) structure. Thus, a detailed description of the memory cell 1100e, except for the differences between the memory cell 1100e of FIG. 6 and the memory cell 1100c of FIG. 4, will be omitted.

The first source region 1113 may have the LDD structure that includes a first impurity region 1113a having a relatively low impurity concentration and a second impurity region 1113b having a relatively high impurity concentration. The first drain region 1114 may include only an impurity region having a relatively low concentration. The first impurity region 1113a may be adjacent to the second impurity region 1113b. The first impurity region 1113a may be formed under the selection transistor 1110e and the first spacer 1115. The second impurity region 1113b may be formed adjacent to the first spacer 1115. Without intending to be bound by this theory, the memory cell 1100e may reduce a short channel effect and/or as reduce a program disturbance since the first source region 1113 of the selection transistor 1110e has the LDD structure.

The memory cell 1100e may also include the halo doped region 1116. The halo doped region 1116 may be positioned so as to surround the first impurity region 1113a and to be adjacent to the second impurity region 1113b.

Figure 7:
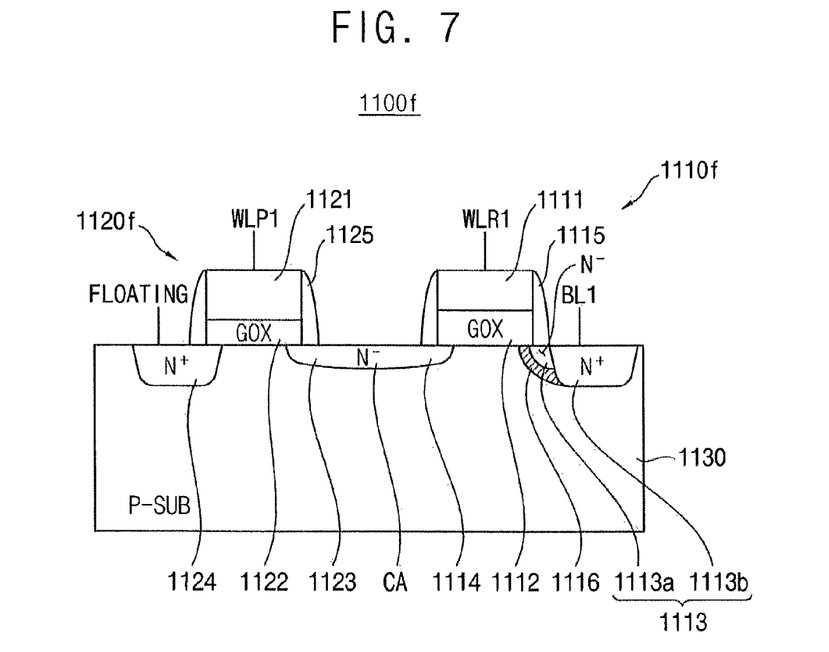

FIG. 7 illustrates a cross-sectional view of another exemplary of a memory cell included in a memory cell array of FIG. 1. FIG. 7 represents a memory cell 1100f that is connected to the read word line WLR1, the program word line WLP1 and the bit line BL1. The memory cell 1100f may include a selection transistor 1110f and an antifuse 1120f.

The memory cell 1100f may have substantially a same structure as the memory cell 1100d of FIG. 5, except that the first source region 1113 of the selection transistor 1110f has the LDD structure. In this case, the first drain region 1114 may include the common impurity region CA. The first source region 1113 having the LDD structure was described above with reference to FIG. 6. Thus, a detailed description of the memory cell 1100f will be omitted.

Figure 8:
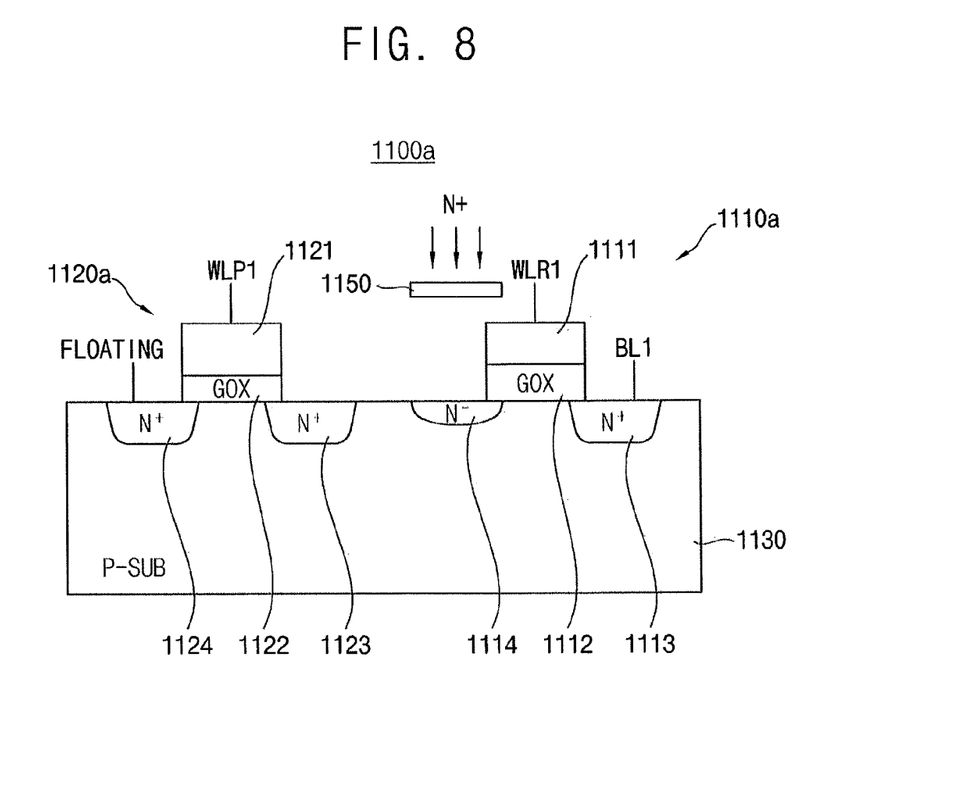
FIG. 8 illustrates a diagram describing an exemplary method of manufacturing a memory cell of FIG. 2.

FIG. 8 illustrates a diagram for describing an exemplary method of manufacturing a memory cell. For ease of explanation the exemplary method of manufacturing a memory cell is described with reference to the memory cell 1100a of FIG. 2. However, embodiments are not limited thereto.

Referring to FIG. 8, the first gate insulation layer 1112 and the second gate insulation layer 1122 may be formed on the substrate 1130. The first gate 1111 may be formed on the first gate insulation layer 1112 and the second gate 1121 may be formed on the second gate insulation layer 1122. Then, after forming the first gate 1111 and the second gate 1121, a first ion implantation process may be used to form the first drain region 1114 at an upper portion of the substrate 1130 adjacent to a first side of the first gate 1111 in a direction of the second gate 1121, e.g., the first drain region 1114 may be formed adjacent to a side of the first gate 1111 that faces the second gate 1121. For example, the first ion implantation process may implant N-type impurities having, e.g., a first concentration N−, into the substrate 1130.

After the first ion implantation process, a mask pattern 1150 may be formed over the substrate 1130, e.g., the mask pattern 1150 may be formed to cover the first drain region 1114 as illustrated in FIG. 8. For example, the mask pattern 1150 may include a photoresist pattern. After the mask pattern 1150 is formed, the first source region 1113, the second source region 1123, and the second drain region 1124 may be formed at the same time by a second ion implantation process.

The second ion implantation process may implant N-type impurities having, e.g., a second concentration N+ that is higher than the first concentration N−, into the substrate 1130. The first source region 1113 may be formed at upper portions of the substrate 1130 adjacent to a second side of the first gate 1111, by the second ion implantation process. The second side of the first gate 1111 may oppose the first side of the first gate 1111. The second drain region 1124 and the second source region 1123 may be formed at upper portions of the substrate 1130 adjacent to a first side and a second side of the second gate 1121, respectively, by the second ion implantation process. The first side of the second gate 1121 may oppose the second side of the second gate 1121. Embodiments are not limited thereto, e.g., the second ion implantation process may be performed before the first ion implantation process.

According to an exemplary embodiment, the first source region 1113, the second source region 1123, and the second drain region 1124 may have substantially the same impurity ion concentrations. As such, the impurity ion concentrations of the first source region 1113, the second source region 1123, and the second drain region 1124 may be higher than the impurity concentration of the first drain region 1114.

After the second ion implantation process, the first spacers 1115 and the second spacers 1125 may be formed. The first spacers 1115 may overlap the first source region 1113 and the first drain region 1114. The second spacers 1125 may overlap the second source region 1123 and the second drain region 1124.

According to an exemplary embodiment, the first drain region 1114 may be formed at a separate time than at least the first source region 1113. If the first drain region 1114, the first source region 1113, the second drain region 1124 and the second source region 1123 were to be formed at the same time by one ion implantation process, the impurity concentrations of the first drain region 1114, the first source region 1113, the second drain region 1124 and the second source region 1123 may be substantially the same.

However, according to an exemplary embodiment, the first drain region 1114 having a relatively low impurity concentration N− may be formed by the first ion implantation process, the mask pattern 1150 may be formed over the substrate 1130 to cover the first drain region 1114, and the first source region 1113, the second drain region 1124 and the second source region 1123 having a relatively high impurity concentration N+ may be formed at the same time by the second ion implantation process. As such, the first drain region 1114 may be formed at a different time than the first source region 1113, the second drain region 1124, and the second source region 1123. Therefore, the first drain region 1114 of the selection transistor 1110a may have a lower impurity concentration than an impurity concentration of the first source region 1113 of the selection transistor 1110a.

Referring to the embodiments illustrated in FIGS. 3, 5, and 7, the common impurity region CA, which may be shared by the first drain region 1114 and the second source region 1123. The common impurity region CA, the first drain region 1114, and the second source region 1123 may be formed at an upper portion of the substrate 1130 between the first gate 1111 and the second gate 1121 by a third ion implantation process. The third ion implantation process may include implanting N-type impurities having a third concentration N− into the substrate 1130. After that, a mask pattern may be formed over the substrate 1130 which covers the common impurity region CA, the first drain region 1114, and the second source region 1123. After the mask pattern is formed, the first source region 1113 and the second drain region 1124 may be formed by a fourth ion implantation process. The fourth ion implantation process may include implanting N-type impurities having a fourth concentration N+, which is higher than the third concentration N−, into the substrate 1130.

Referring to the embodiment illustrated in FIGS. 4 and 5, the halo doped region 1116 may be formed by implanting impurities having a relatively high concentration into the substrate 1130 after forming a mask pattern exposing the second portion of the substrate 1130. The mask pattern may only expose the second portion of the substrate 1130 such that the halo doped region 1116 is formed only in the second portion of the substrate 1130. After the halo doped region 1116 is formed, the first drain region 1114 may be formed by the first ion implantation process and the first source region 1113, the second drain region 1124 and the second source region 1123 may be formed by the second ion implantation process, which were described with reference to FIG. 8.

Referring to the embodiment illustrated in FIGS. 6 and 7, in order to form the first source region 1113 that has the LDD structure, the first impurity region 1113a may be formed before forming the first spacers 1115. The first impurity region 1113a may be formed by implanting N-type impurities having a relatively low concentration N− into a portion of the substrate 1130 where the first source region 1113 is to be formed. After the first spacers 1115 are formed, the second impurity region 1113*b* may be formed by implanting N-type impurities having a relatively high concentration N+ into the portion of the substrate 1130 where the first source region 1113 is formed. The halo doped region 1116 may be formed before forming the first impurity region 1113*a*.

Hereinafter, a programming operation of the memory cell array 1000 including the plurality of memory cells 1100 will described with reference to FIGS. 1 and 2.

In the programming operation described below, a selected memory cell 1100, which may be connected to a selected program word line WLP1, a selected read word line WLR1 and a selected bit line BL1, may be programmed. At the same time, non-selected memory cells 1100, other than the selected memory cell 1100, included in the memory cell array 1000 are not programmed.

A program voltage, which is a relatively high voltage, may be applied to the selected program word line, e.g., WLP1, and a selection voltage, which may be lower than the program voltage, may be applied to the selected read word line, e.g., WLR1. A ground voltage 0V may be applied to non-selected program word lines, e.g., WLP2, . . . , WLPn and non-selected read word lines, e.g., WLR2, . . . , WLRn. The ground voltage 0V may be applied to the selected bit line BL1, and the selection voltage may be applied to non-selected bit lines BL2, . . . , BLm. For example, the program voltage may be about 7V, and the selection voltage may be about 3V.

The selected memory cell 1100 may include a selection transistor STR1 and an antifuse AF1. According to an exemplary embodiment, the selection voltage may be applied to the first gate 1111 of the selection transistor STR1 through the selected read word line WLR1, and the ground voltage 0V may be applied to the source region 1113 of the selection transistor STR1 through the selected bit line BL1. Therefore, the selection transistor STR1 may be turned on and a voltage of a first node CB1, which corresponds to the first drain region 1114 of the selection transistor STR1, may be the ground voltage 0V. The program voltage may be applied to the second gate 1121 of the antifuse AF1 through the selected program word line WLP1, and, as described above, the voltage of the first node CB1, which corresponds to the second source region 1123 of the antifuse AF1, may be the ground voltage 0V. Therefore, an intensive electric field may be applied to the second gate insulation layer 1122 of the antifuse AF1 to break down an insulating property of the second gate insulation layer 1122 so that the selected memory cell 1100 is programmed.

The non-selected memory cells 1100 that are connected to the non-selected program word lines WLP2, . . . , WLPn and the non-selected read word lines WLR2, . . . , WLRn may not be programmed since the ground voltage 0V is applied to both the non-selected program word lines WLP2, . . . , WLPn and the non-selected read word lines WLR2 so that the intensive electric field is not applied to the second gate insulation layer 1122.

The non-selected memory cells 1100 that are connected to the selected program word line WLP1, the selected read word line WLR1, and the non-selected bit lines BL2, . . . , BLm may not be programmed either. An operation of the non-selected memory cell 1100, which may be connected to the selected program word line WLP1, the selected read word line WLR1, and the non-selected bit line BL2 and includes a selection transistor STR2 and an antifuse AF2, in a programming mode will be described below.

The selection voltage may be applied to both the selected read word line WLR1 and the non-selected bit line BL2. Therefore, a voltage difference between the first gate 1111 of the selection transistor STR2 and the first source region 1113 of the selection transistor STR2 may be zero so that the selection transistor STR2 is turned off and a second node CB2, which corresponds to the first drain region 1114 of the selection transistor STR2, is floated. When the program voltage is applied to the second gate 1121 of the antifuse AF2 through the selected program word line WLP1, a voltage of the second node CB2 may be boosted to the program voltage by a coupling effect. Therefore, an intensive electric field may not be applied to the second gate insulation layer 1122 of the antifuse AF2, even if the program voltage is applied to the second gate of the antifuse AF2. In this case, the voltage of the second node CB2, which corresponds to the first drain region 1114 of the selection transistor STR2, may be the program voltage and a voltage of the first gate 1111 of the selection transistor STR2 may be the selection voltage, which is lower than the program voltage.

If a voltage of a drain region is higher than a voltage of a gate, e.g., in a MOSFET, an electric field may be applied to portions of a gate insulation layer in which the gate and the drain region overlap. In this case, a deep depletion area may be formed in the drain region and an energy band may bend sharply so that band-to-band tunneling and/or trap-assisted tunneling of an electron increases. Therefore, a leakage current, that is the gate-induced drain leakage (GIDL) current, may occur in the drain region. As the voltage of the drain region is higher than the voltage of the gate, the GIDL current increases.

Further to the above, the voltage of the second node CB2, which corresponds to the first drain region 1114 of the selection transistor STR2, may be the program voltage, and the voltage of the first gate 1111 of the selection transistor STR2 may be the selection voltage, which is lower than the program voltage, as described above. Therefore, the GIDL current may occur in the first drain region 1114 of the selection transistor STR2. If the GIDL current occurs in the first drain region 1114 of the selection transistor STR2, the voltage of the second node CB2 may decrease from the program voltage so that a voltage difference between the second gate 1121 of the antifuse AF2, to which the program voltage is applied, and the second node CB2 may increase. Therefore, the intensive electric field may be applied to the second gate insulation layer 1122 of the antifuse AF2 to break down an insulating property of the second gate insulation layer 1122 of the antifuse AF2 so that the non-selected memory cell 1100, which is connected to the selected read word line WLR1, the selected program word line WLP1, and the non-selected bit line BL2, may be programmed and may cause a program disturbance.

According to exemplary embodiments, as described above with reference to FIG. 2, the memory cell 1100*a* may include the selection transistor 1110*a* having an asymmetrical structure such that the first drain region 1114 of the selection transistor 1110*a* has a lower impurity concentration than an impurity concentration of the first source region 1113 of the selection transistor 1110*a*. Therefore, even if the voltage of the first drain region 1114 of the selection transistor STR2 is higher than the voltage of the first gate 1111 of the selection transistor STR2, a width of the depletion area formed in the first drain region 1114 of the selection transistor STR2 may be large so that band-to-band tunneling and/or trap-assisted tunneling of an electron may be decreased. Therefore, the GIDL current that may occur in the first drain region 1114 of the selection transistor STR2 may be decreased and the voltage of the second node CB2, which corresponds to the second source region 1123 of the antifuse AF2, may be maintained at the program voltage. As a result, the intensive electric field may not be applied to the second gate insulation layer 1122 of the antifuse AF2, and the non-selected memory cells 1100, which are connected to the selected program word line WLP1, the selected read word line WLR1, and the non-selected bit lines BL2, ..., BLm, may not be programmed such that program disturbance may be reduced.

As described above, the memory cell array 1000 including the plurality of memory cells 1100 according to exemplary embodiments may be programmed without program disturbance.

Referring to the exemplary embodiment illustrated in FIG. 2, the first gate insulation layer 1112 of the selection transistor 1110a may be thicker than the second gate insulation layer 1122 of the antifuse 1120a. The GIDL current may occur when a voltage of the first drain region 1114 of the selection transistor 1110a is higher than a voltage of the first gate 1111 of the selection transistor 1110a so that the intensive electric field is applied to portions of the first gate insulation layer 1112 in which the first gate 1111 and the first drain region 1114 overlap. Therefore, when a thickness of the first gate insulation later 1112 increases, an intensity of the electric field applied to the portions of the first gate insulation layer 1112 may be reduced and the GIDL may be reduced.

Figure 9:
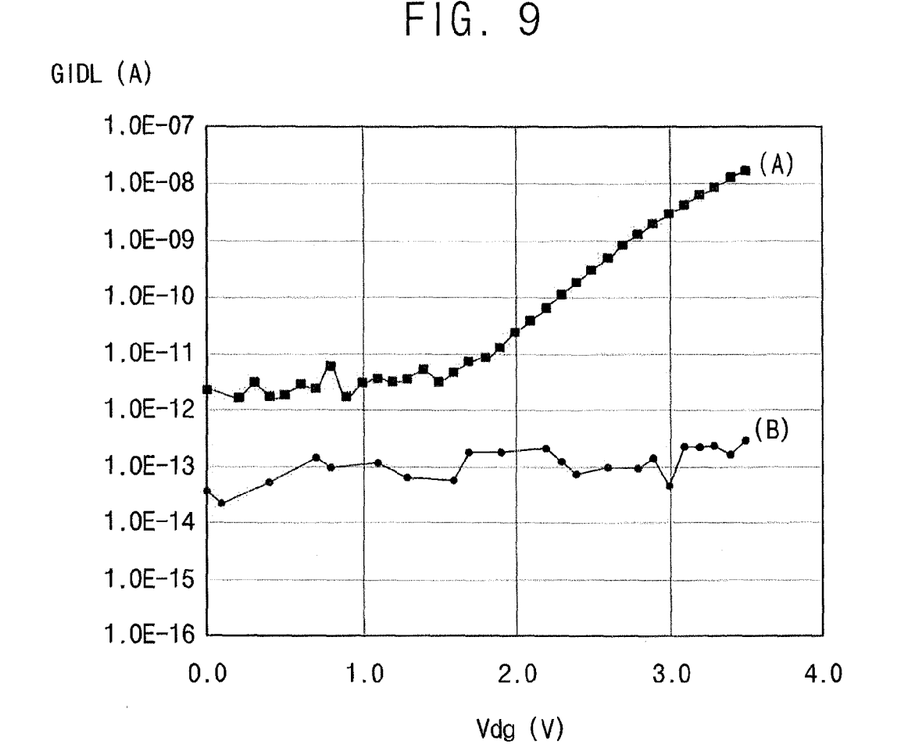
FIG. 9 illustrates a graph describing a decrease of a gate induced drain leakage (GIDL) current in a memory cell array of FIG. 1.

FIG. 9 illustrates a graph for describing a decrease of a gate induced drain leakage (GIDL) current in a memory cell according to exemplary embodiments.

In FIG. 9, an upper graph (A) represents a change of a GIDL current in response to a voltage difference between a drain region and a gate Vdg in a conventional memory cell. A lower graph (B) represents a change of a GIDL current in response to a voltage difference between a drain region and a gate Vdg in the memory cell 1100 according to exemplary embodiments.

Referring to the upper graph (A) of the conventional memory cell, the GIDL current increases as the voltage difference between the drain region and the gate Vdg increases. On the other hand, referring to the lower graph (B) of the memory cell 1100, the GIDL current does not increase as the voltage difference between the drain region and the gate Vdg increases. That is, the memory cell 1100 may decrease the GIDL current even if the voltage difference between the drain region and the gate Vdg is high. Therefore, as described above, the memory cell 1100 may reduce a program disturbance.

Figure 10:
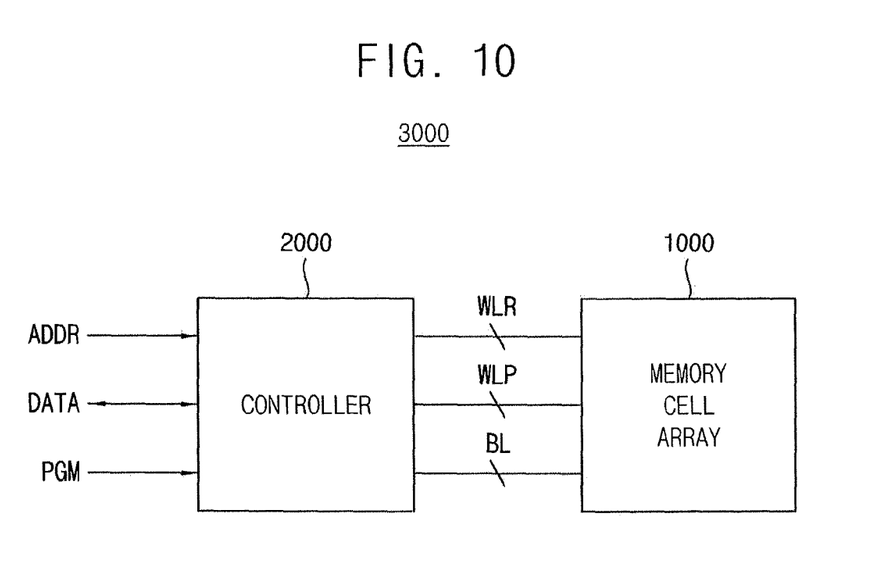
FIG. 10 illustrates a block diagram of a non-volatile memory device, according to an exemplary embodiment.

FIG. 10 illustrates a block diagram of a non-volatile memory device according to exemplary embodiments. The non-volatile memory device 3000 may include a memory cell array 1000 and a controller 2000.

The memory cell array may include a plurality of memory cells. The memory cell array 1000 may have substantially a same structure as the memory cell array 1000 of FIG. 1. Each of the plurality of memory cells included in the memory cell array 1000 of FIG. 10 may include, e.g., one of the memory cells 1100a, 1100b, 1100c, 1100d, 1100e, and 1100f. Structures and operations of the memory cells 1100a, 1100b, 1100c, 1100d, 1100e, and 1100f are described above with reference to FIGS. 1 to 9. Thus, a detailed description of the memory cells included in the memory cell array 1000 of FIG. 10 will be omitted.

The controller 2000 may be connected to the memory cell array 1000 by a plurality of program word lines WLP, a plurality of read word lines WLR, and a plurality of bit lines BL. The controller 2000 may perform a programming operation or a reading operation on the memory cell array 1000 according to an operation mode. For example, the controller 2000 may perform the programming operation on the memory cell array 1000 in response to an address ADDR and a data DATA received from an outside device when a program signal PGM received from the outside device is at a first level. The controller 2000 may perform the reading operation on the memory cell array 1000 to provide a read data DATA to the outside device in response to the address ADDR when the program signal PGM is at a second level.

The non-volatile memory device 3000 may be used as storage, e.g., a one time programmable (OTP) memory, since the non-volatile memory device 3000 may use antifuses to store data. For example, the non-volatile memory device 3000 may be used as a read only memory (ROM) to store system information in an electronic device. The non-volatile memory device 3000 may also be used to store an identification number for copyright management in an integrated circuit (IC).

Figure 11:
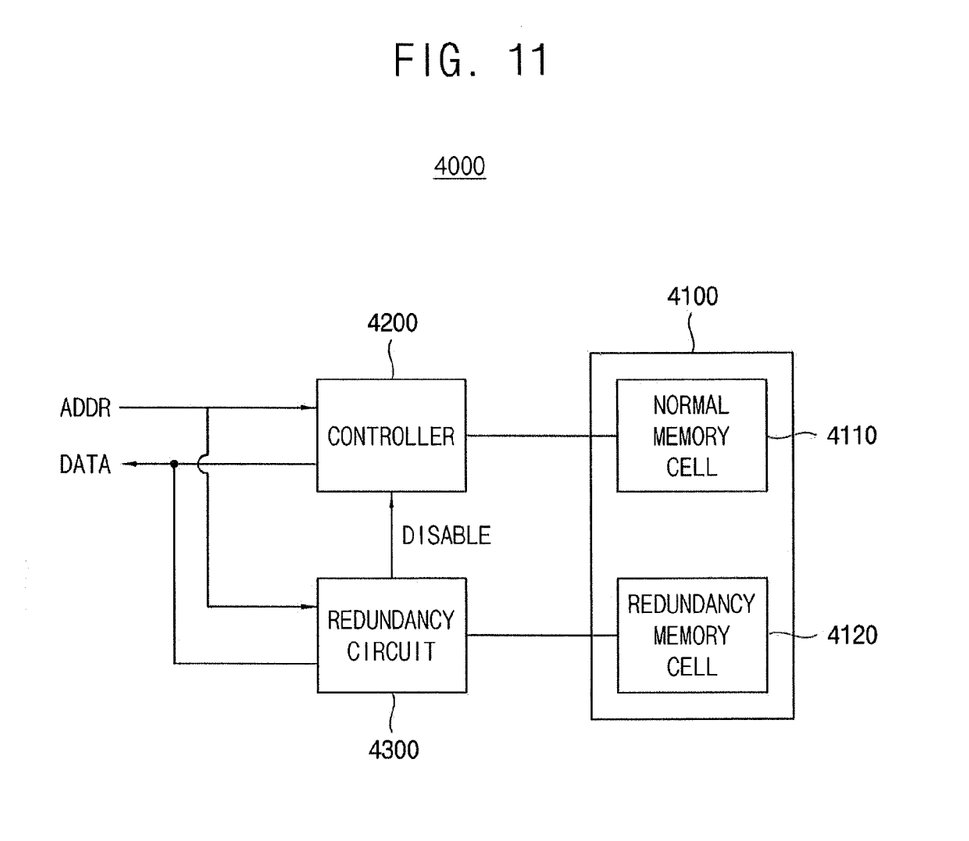
FIG. 11 illustrates a block diagram of a memory device having a repair function, according to an exemplary embodiment.

FIG. 11 illustrates a block diagram of a memory device having a repair function, e.g., a repair device, according to exemplary embodiments. Referring to FIG. 11, a memory device 4000 may include a memory cell array 4100, a controller 4200, and a redundancy circuit 4300.

The memory cell array 4100 may include normal memory cells 4110 and redundancy memory cells 4120. The redundancy memory cells 4120 may replace a failed cell among the normal memory cells 4110, when necessary.

The controller 4200 may write into the normal memory cells 4110 in response to an address ADDR and a data DATA received from outside or reads from the normal memory cells 4110 to provide a read data DATA to outside in response to the address ADDR.

The redundancy circuit 4300 includes a plurality of memory cells. Each of the plurality of memory cells included in the redundancy circuit 4300 may include one of the memory cells 1100a, 1100b, 1100c, 1100d, 1100e, and 1100f. Structures and operations of the memory cells 1100a, 1100b, 1100c, 1100d, 1100e, and 1100f are described above with reference to FIGS. 1 to 9. Thus, a detailed description of the plurality of memory cells included in the redundancy circuit 4300 will be omitted.

The redundancy circuit 4300 may store an address of a failed cell among the normal memory cells 4110 into the plurality of memory cells. The redundancy circuit 4300 may determine whether the address ADDR received from the outside is the same as the address of the failed cell stored in the plurality of memory cells. When the address ADDR received from outside is the same as the address of the failed cell stored in the plurality of memory cells, the redundancy circuit 4300 disables the controller 4200 by providing a disable signal DISABLE to the controller 4200, and reads from or writes into a redundancy memory cell 4120 corresponding to the failed cell.

The controller 4200 may stop operating when the controller 4200 receives the disable signal DISABLE from the redundancy circuit 4300.

The memory device 4000 may be, e.g., a dynamic random access memory (DRAM), a static random access memory (SRAM), a phase change random access memory (PRAM), a ferroelectric random access memory (FRAM), a resistive random access memory (RRAM), a magnetic random access memory (MRAM), etc.

By way of summation and review, an antifuse may include a MOSFET, and the MOSFET may be programmed by applying a high voltage to a gate insulation layer of the MOSFET to break down an insulating property of the gate insulation layer. A memory cell array may include antifuses arranged in a matrix form. When a selected antifuse among the antifuses included in the memory cell array is programmed, the non-selected antifuses that are not the selected antifuse may be programmed such as to cause a program disturbance.

Embodiments, e.g., the exemplary embodiments discussed above, relate to a memory cell using an antifuse, methods of manufacturing the memory cell, and a memory device including the memory cell. As described above, the memory cell according to exemplary embodiments may reduce a program disturbance by decreasing the GIDL current.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory cell, comprising:
a selection transistor formed on a substrate, the selection transistor including:
a first gate connected to a read word line,
a first gate insulation layer that insulates the first gate from the substrate,
a first source region connected to a bit line, and
a first drain region, an impurity concentration of the first drain region being lower than an impurity concentration of the first source region; and
an antifuse formed on the substrate, the antifuse including:
a first electrode connected to a program word line, and
a second electrode connected to the selection transistor; wherein:
the second electrode of the antifuse is connected to the first drain region of the selection transistor, and
the substrate includes a first portion and a second portion, the first portion of the substrate being adjacent to a side of the first drain region that faces the first source region, the second portion of the substrate being adjacent to a side of the first source region that faces the first drain region, and an impurity concentration of the first portion of the substrate being lower than an impurity concentration of the second portion of the substrate.

2. The memory cell as claimed in claim 1, further comprising a halo doped region, the halo doped region being only in the second portion of the substrate between the first drain region and the first source region.

3. The memory cell as claimed in claim 1, wherein the first source region has a lightly doped structure, the lightly doped structure including a first impurity region and a second impurity region, an impurity concentration of the first impurity region being lower than an impurity concentration of the second impurity region, and the first drain region including only an impurity region having the impurity concentration of the first impurity region.

4. A memory cell, comprising:
a selection transistor formed on a substrate, the selection transistor including:
a first gate connected to a read word line,
a first gate insulation layer that insulates the first gate from the substrate,
a first source region connected to a bit line, and
a first drain region, an impurity concentration of the first drain region being lower than an impurity concentration of the first source region; and
an antifuse formed on the substrate, the antifuse including:
a first electrode connected to a program word line, and
a second electrode connected to the selection transistor, wherein:
the second electrode of the antifuse is connected to the first drain region of the selection transistor,
the antifuse includes:
a second gate connected to the program word line,
a second gate insulation layer that insulates the second gate from the substrate,
a second source region connected to the first drain region, and
a second drain region that is floated, and
the first gate insulation layer is thicker than the second gate insulation layer.

5. The memory cell as claimed in claim 4, wherein the second source region is spaced apart from the first drain region in the substrate, and the second source region is electrically connected to the first drain region by a wiring on the substrate.

6. The memory cell as claimed in claim 5, wherein:
the first drain region is formed by a first ion implantation process, and the first source region, the second source region, and the second drain region are formed by a second ion implantation process, and
the impurity concentration of the first drain region is lower than the impurity concentration of the first source region, an impurity concentration of the second source region, and an impurity concentration of the second drain region formed by the second ion implantation process.

7. The memory cell as claimed in claim 4, wherein the second source region is electrically connected to the first drain region by a common impurity region between the second source region and the first drain region.

8. The memory cell as claimed in claim 7, wherein the first drain region and the second source region are formed by a first ion implantation process, and the first source region and the second drain region are formed by a second ion implantation process, and
the impurity concentration of the first drain region and an impurity concentration of the second source region formed by the first ion implantation process are lower than the impurity concentration of the first source region and an impurity concentration of the second drain region formed by the second ion implantation process.

9. A method of manufacturing a memory cell, the method comprising:
forming a first insulation layer and a second insulation layer on a substrate;
forming a first gate and a second gate on the first gate insulation layer and on the second gate insulation layer, respectively;
forming a first drain region at upper portions of the substrate adjacent to a first side of the first gate in a direction of the second gate by implanting impurities into the substrate;
forming a mask pattern over the substrate, the mask pattern that covers the first drain region; and
forming a first source region at upper portions of the substrate adjacent to a second side of the first gate, a second drain region and a second source region at upper portions of the substrate adjacent to a first side and a second side of the second gate, respectively, by implanting impurities into the substrate, an impurity concentration of the first drain region being lower than an impurity concentration of the first source region.

10. A non-volatile memory device, comprising:

a memory cell array including a plurality of memory cells, each of the plurality of memory cells including a selection transistor on a substrate and an antifuse on the substrate; and a controller that performs a programming operation or a reading operation on the memory cell array according to an operation mode, the selection transistor including a gate connected to a read word line, a gate insulation layer that insulates the gate from the substrate, a source region connected to a bit line, and a drain region, an impurity concentration of the drain region being lower than an impurity concentration of the source region; and the antifuse including a first electrode connected to a program word line and a second electrode connected to the selection transistor, wherein:

the second electrode of the antifuse is connected to the drain region of the selection transistor, and the substrate includes a first portion and a second portion, the first portion of the substrate being adjacent to a side of the drain region that faces the source region, the second portion of the substrate being adjacent to a side of the source region that faces the drain region, and an impurity concentration of a first portion of the substrate being lower than an impurity concentration of the second portion of the substrate.

11. The non-volatile memory device as claimed in claim 10, wherein the substrate includes a halo doped region, the halo doped region being only in the second portion of the substrate between the drain region and source region.

12. A memory device, comprising:

a memory cell array including normal memory cells and redundancy memory cells; and a redundancy circuit including a plurality of memory cells, the plurality of memory cells storing an address of a failed cell among the normal memory cells such that when an address received from an outside for a read or write operation corresponds to the address of the failed cell stored in the plurality of memory cells the read or write operation is directed to the redundancy memory cells;

each of the plurality of memory cells in the redundancy circuit including a selection transistor on a substrate and an antifuse on the substrate, the selection transistor including:
 a gate connected to a read word line,
 a gate insulation layer insulating the gate from the substrate,
 a source region connected to a bit line, and
 a drain region, an impurity concentration of the drain region being lower than an impurity concentration of the source region; and the antifuse including:
 a first electrode connected to a program word line, and
 a second electrode connected to the selection transistor,
wherein:

the second electrode of the antifuse is connected to the drain region of the selection transistor, and the substrate includes a first portion and a second portion, the first portion of the substrate being adjacent to a side of the drain region that faces the source region, the second portion of the substrate being adjacent to a side of the source region that faces the drain region, and an impurity concentration of the first portion of the substrate being lower than an impurity concentration of the second portion of the substrate.

13. The memory device as claimed in claim 12, wherein the substrate includes a halo doped region, the halo doped region being only in the second portion of the substrate between the drain region and the source region.

* * * * *